(12) United States Patent
Ho et al.

(10) Patent No.: US 8,766,724 B2
(45) Date of Patent: Jul. 1, 2014

(54) APPARATUS AND METHOD FOR SENSING AND CONVERTING RADIO FREQUENCY TO DIRECT CURRENT

(75) Inventors: Daniel Ho, Palo Alto, CA (US); Malcolm Smith, San Jose, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 83 days.

(21) Appl. No.: 13/310,593

(22) Filed: Dec. 2, 2011

(65) Prior Publication Data

US 2012/0139645 A1 Jun. 7, 2012

Related U.S. Application Data

(60) Provisional application No. 61/419,862, filed on Dec. 5, 2010.

(51) Int. Cl.
*H03F 1/30* (2006.01)
*H03F 1/52* (2006.01)

(52) U.S. Cl.
USPC ............................ 330/290; 330/285; 330/298

(58) Field of Classification Search
USPC .................... 330/140, 285, 296, 298, 97, 290
See application file for complete search history.

(56) References Cited

U.S. PATENT DOCUMENTS

| | | | |
|---|---|---|---|
| 2,681,953 A | 6/1954 | Bradburd | |
| 2,797,267 A | 6/1957 | Yost, Jr. | |
| 3,151,301 A | 9/1964 | Bettin | |
| 3,287,653 A | 11/1966 | Goordman | |
| 3,356,959 A | * 12/1967 | Vilkomerson | 330/293 |
| 3,441,865 A | 4/1969 | Siwko | |
| 3,524,142 A | 8/1970 | Valdettaro | |
| 3,959,603 A | 5/1976 | Nilssen et al. | |
| 4,032,973 A | 6/1977 | Haynes | |
| 4,087,761 A | 5/1978 | Fukumoto et al. | |
| 4,232,270 A | 11/1980 | Marmet et al. | |
| 4,511,857 A | 4/1985 | Gunderson | |
| 4,772,858 A | 9/1988 | Tsukii et al. | |
| 4,791,421 A | 12/1988 | Morse et al. | |
| 4,977,366 A | 12/1990 | Powell | |
| 5,023,566 A | 6/1991 | El-Hamamsy et al. | |
| 5,412,344 A | 5/1995 | Franck | |
| 5,521,561 A | 5/1996 | Yrjola et al. | |
| 5,589,796 A | 12/1996 | Alberth, Jr. et al. | |
| 6,060,752 A | 5/2000 | Williams | |
| 6,271,727 B1 | 8/2001 | Schmukler | |
| 6,411,098 B1 | 6/2002 | Laletin | |
| 6,696,902 B2 | 2/2004 | Lerke et al. | |
| 6,741,483 B1 | 5/2004 | Stanley | |

(Continued)

*Primary Examiner* — Steven J Mottola
(74) *Attorney, Agent, or Firm* — Withrow & Terranova, P.L.L.C.

(57) ABSTRACT

The apparatus and method thereof accurately sense and convert a radio frequency (RF) current signal to direct current (DC) independent of process variation and temperature, and without requiring high speed, high voltage amplifiers for its operation. The apparatus comprises an AC coupled circuit that couples the RF signal from the main device to a sense device with an N:M ratio, a low pass filter system that extracts the DC content of the RF current signal, and a negative feedback loop that forces the DC content of the main device and the sensed device to be equal. Exemplary embodiments include a current sensor that provides feedback to protect an RF power amplifier from over-current condition, and a RF power detection and control in a RF power amplifier (PA) that multiplies the sensed output current by the sensed output voltage to be used as a feedback to control the PA's bias.

18 Claims, 4 Drawing Sheets

(56) References Cited

U.S. PATENT DOCUMENTS

| | | |
|---|---|---|
| 6,828,862 B2 | 12/2004 | Barak |
| 6,841,981 B2 | 1/2005 | Smith et al. |
| 6,990,357 B2 | 1/2006 | Ellä et al. |
| 7,003,265 B2 | 2/2006 | Jeon et al. |
| 7,079,816 B2 | 7/2006 | Khorram et al. |
| 7,120,399 B2 | 10/2006 | Khorram |
| 7,138,872 B2 | 11/2006 | Blednov |
| 7,155,252 B2 | 12/2006 | Martin et al. |
| 7,180,373 B2 | 2/2007 | Imai et al. |
| 7,187,945 B2 | 3/2007 | Ranta et al. |
| 7,245,887 B2 | 7/2007 | Khorram |
| 7,260,363 B1 | 8/2007 | Snodgrass |
| 7,269,441 B2 | 9/2007 | Ellä et al. |
| 7,292,098 B2 | 11/2007 | Chen et al. |
| 7,315,438 B2 | 1/2008 | Hargrove et al. |
| 7,365,605 B1 | 4/2008 | Hoover |
| 7,420,416 B2 | 9/2008 | Persson et al. |
| 7,420,425 B2 | 9/2008 | Tsai |
| 7,449,946 B1 | 11/2008 | Hoover |
| 7,468,638 B1 | 12/2008 | Tsai et al. |
| 7,623,859 B2 | 11/2009 | Karabinis |
| 7,639,084 B2 | 12/2009 | Liao et al. |
| 7,652,464 B2 | 1/2010 | Lang et al. |
| 7,663,444 B2 | 2/2010 | Wang |
| 7,679,448 B1 * | 3/2010 | McAdam et al. ............. 330/285 |
| 7,768,350 B2 | 8/2010 | Srinivasan et al. |
| 7,869,773 B2 | 1/2011 | Kuijken |
| 7,890,063 B2 | 2/2011 | Ahn et al. |
| 7,920,833 B2 | 4/2011 | Qiao et al. |
| 7,924,209 B2 | 4/2011 | Kuo et al. |
| 7,948,305 B2 | 5/2011 | Shirokov et al. |
| 7,986,186 B2 | 7/2011 | Marbell et al. |
| 8,027,175 B2 | 9/2011 | Liu et al. |
| 2003/0078011 A1 | 4/2003 | Cheng et al. |
| 2003/0193371 A1 | 10/2003 | Larson et al. |
| 2005/0052296 A1 | 3/2005 | Manlove et al. |
| 2005/0122163 A1 | 6/2005 | Chu |
| 2007/0008236 A1 | 1/2007 | Tillery et al. |
| 2007/0075784 A1 | 4/2007 | Pettersson et al. |
| 2008/0102762 A1 | 5/2008 | Liu et al. |
| 2008/0129642 A1 | 6/2008 | Ahn et al. |
| 2009/0073078 A1 | 3/2009 | Ahn et al. |
| 2009/0195946 A1 | 8/2009 | Kleveland |
| 2009/0296855 A1 | 12/2009 | Kitamura et al. |
| 2010/0063497 A1 | 3/2010 | Orszulak |
| 2010/0105340 A1 | 4/2010 | Weissman |
| 2010/0203922 A1 | 8/2010 | Knecht et al. |
| 2010/0321096 A1 | 12/2010 | Sudjian |
| 2011/0025408 A1 | 2/2011 | Cassia et al. |
| 2011/0025422 A1 * | 2/2011 | Marra et al. ................... 330/296 |
| 2011/0074509 A1 | 3/2011 | Samavedam et al. |
| 2011/0143690 A1 | 6/2011 | Jerng et al. |
| 2011/0148521 A1 | 6/2011 | Albers et al. |
| 2011/0199146 A1 | 8/2011 | Bakalski et al. |
| 2011/0242858 A1 | 10/2011 | Strzalkowski |
| 2012/0049925 A1 | 3/2012 | Ha et al. |

* cited by examiner

APPARATUS AND METHOD FOR SENSING AND CONVERTING RADIO FREQUENCY TO DIRECT CURRENT

CROSS-REFERENCE TO RELATED APPLICATIONS

This application claims the benefit of U.S. Provisional Patent Application No. 61/419,862 filed Dec. 5, 2010.

BACKGROUND OF THE INVENTION

1. Field of the Invention

The invention generally relates to current sensing applications, and more particularly to current sensing in radio frequency (RF) power amplifier.

2. Prior Art

Unlike current sensing in low speed circuit such as direct current to direct current (DC-DC) switching regulators or low dropout regulator (LDO), etc., the RF cellular power operates at very high-frequency, typically at frequencies above 1 GHz. Any analog circuits with feedback control loop to process high frequency will necessarily use lots of current and therefore decrease the efficiency of the system. Prior art examples the DC average current is sensed through an amplifier.

FIG. 1 depicts a prior art schematic diagram 100 of a DC average current sensed through an amplifier. The supply of the RF power amplifier 120 is not connected directly to the battery. Rather, it is regulated by a voltage regulator 110. With the RF choke inductor 124, the drain current of NMOS 126 is modulated with RF frequency, but the current through the voltage regulator 110 is the average DC current through MOS 126. Therefore, sensing this DC current is relatively simple with the current sense loop 130, where Isense_dc=Ivbat_dc/K, where K is the aspect ratio between the MOS 126 and the sense MOS 136 and Ivbat_dc is the DC current from the battery flowing through the inductor 124. The drawback of this prior solution is that the voltage regulator 110 consumes a large area and therefore also power, which results in overall power amplifier (PA) efficiency degradation.

In other prior art solutions that PA does not have the voltage regulator to control the supply, rather, the supply is connected directly to $V_{BAT}$. In order to sense the DC current, an off-chip external resistor Rsense (not shown) that is used connected between the RF choke inductor and the battery. The DC current drops across this resistor to create a sense voltage where Vsense=Idc×Rsense. Vsense is then brought back into chip to perform various signal processing controls. The drawback of this kind of solution is that the external resistor has to be very small, e.g., in the order of milliohms. This resistor can be expensive and consumes a large area. Also, when the sensed voltage is brought back into the chip, the accuracy may be compromised.

Therefore, in view of the deficiencies of the prior art, it would be advantageous to provide a solution that overcomes these deficiencies.

DETAILED DESCRIPTION OF THE PREFERRED EMBODIMENTS

The apparatus and method thereof accurately sense and convert a radio frequency (RF) current signal to direct current (DC) independent of process variation and temperature, and without requiring high speed, high voltage amplifiers for its operation. The apparatus comprises an AC coupled circuit that couples the RF signal from the main device to a sense device with an N:M ratio, a low pass filter system that extracts the DC content of the RF current signal, and a negative feedback loop that forces the DC content of the main device and the sensed device to be equal. Exemplary embodiments include a current sensor that provides feedback to protect an RF power amplifier from over-current condition, and a RF power detection and control in a RF power amplifier (PA) that multiplies the sensed output current by the sensed output voltage to be used as a feedback to control the PA's bias.

Figure 1:
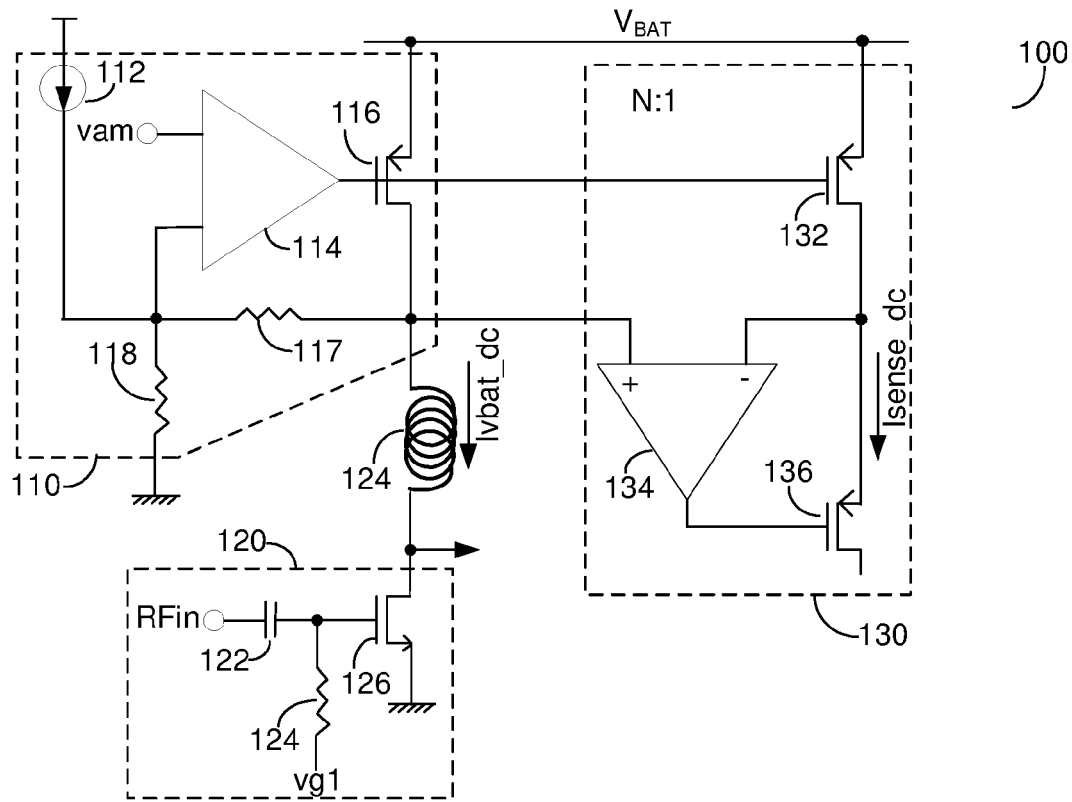
FIG. 1 is a schematic diagram of a DC average current sensed through an amplifier.
Figure 2:
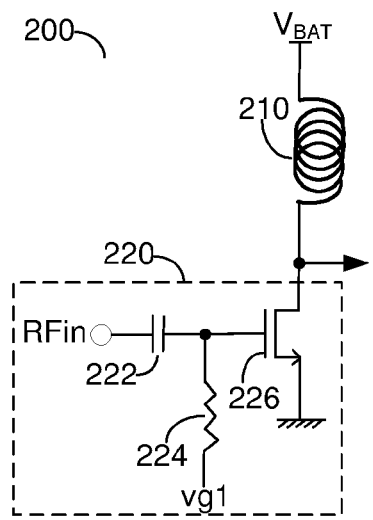
FIG. 2 is a schematic diagram of the RF power amplifier section.

As discussed with respect of the prior art, it is advantageous in term of efficiency and area for an RF PA not to have a voltage regulator, and have the drain of MOS 126 of the PA to connect directly to the battery through the RF choke inductor 124. In this configuration, it is better to sense the RF current without the sense resistor as discussed in the prior art. Accordingly the invention discloses sensing of the RF current without the voltage regulator and without the sense resistor. Therefore a brief discussion of the circuit shown in FIG. 2 is now due. For the MOS 226 in saturation the drain current is:

$$I_d = \frac{1}{2}\frac{W}{L}\mu C_{ox}(V_{gs} - V_t)^2(1 + \lambda V_{ds})$$

The MOS 226 current in the linear region is:

$$I_d = \frac{W}{L}\mu C_{ox}[(V_{gs} - V_t)V_{ds} - 0.5V_{ds}^2]$$

In either region, the drain current is a function of Vgs, Vds and W/L. Cox is the capacitance of the oxide layer of the MOS device. μ is the charge-carrier effective mobility of the MOS device. Vt is the threshold voltage of the MOS device. Vgs is the gate to source voltage of the MOS device. Vds is the drain to source voltage of the MOS device. L is a channel length modulation parameter that models current dependence on drain voltage due to the Early effect. Therefore, in order to replicate, or otherwise sense, the current accurately, Vgs and Vds need to be forced to be equal, and then drain current will be scaled according to W/L. There are several advantages using the RF sensing circuit suggested by the invention. Among others these include the fact that all the components are on-chip which results in better matching, accuracy of the RF current copied to the sense device, no need for a sense resistor in the main signal path resulting in increased efficiency, low power as the analog circuit feedback does not see the RF signals toggling at high frequencies typically larger than 1 GHz, and extracting the DC value of the sensed RF current and feeding that to an over current protection (OCP) loop.

Figure 3:
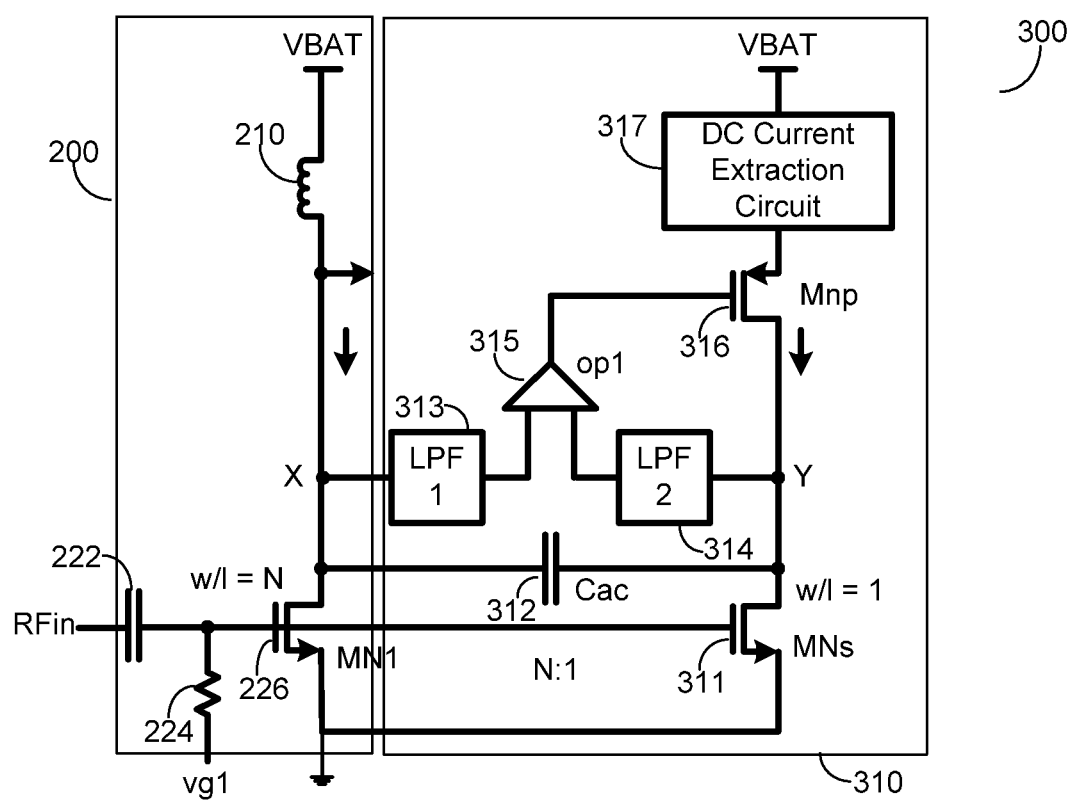
FIG. 3 is a schematic diagram of the RF power amplifier with a sensing circuitry in accordance with the principles of the invention.

Reference is now made to FIG. 3 that depicts an exemplary and non-limiting schematic diagram 300 of the RF PA 200 with a sensing circuitry 310 in accordance with the principles of the invention. NMOS 226 (see FIG. 2 for reference) is the main transistor 226 of the RF PA 200 with an aspect ratio N=W/L. NMOS 311 is the sense device of the sensing circuit 310, with an aspect ratio of M=W/L, and in a preferred embodiment of the invention M=1. Therefore, if the RF signals at Vds and Vgs of NMOS 226 and NMOS 311 are forced to be equal, then the RF current in NMOS 311 replicates accurately with a ratio of N:1 the RF current in NMOS 226. As the gate and the source of NMOS 226 and NMOS 311 are connected respectively, they have the same gate-source voltage ($V_{GS}$).

In order to force the drain-source voltage to be equal for both NMOS 226 and NMOS 311, it is noted that for high frequency, i.e., RF, the drain voltage of NMOS 226 has a DC component and AC components. Therefore, in this invention, the LPF1 is used to extract the dc-component from the high frequency RF signal at the drain of 226. The AC-coupling capacitor Cac 312 is used to couple the AC high frequency drain signal from NMOS 226 to NMOS 311. However, the capacitor 312 only couples the AC component without the DC component. In order to force the DC components at node X and Y, i.e., the drain nodes of NMOS 226 and NMOS 311 respectively, to be the same, a low pass filter LPF2 314 and a negative-feedback loop that consists of op-amp 315 and PMOS 316 are used. Essentially, the low-pass filter systems LPF1 313 and LPF2 314 and the op-amp feedback loop 316 force the DC components at node X and Y to be equal. It should be noted that LPF 313 and/or LPF 314 can be implemented as a simple filter, a zero order filter or an $n^{th}$ degree filter where 'n' is an integer value of 1 or more. LPF 313 and/or LPF 314 can be implemented as either passive filters or active filters, without departing from the scope of the invention. It should be further noted that the op-amp 315 can be implemented simply as a common gate or common source amplifier, or as complicated as any type of operational amplifier, without departing from the scope of the invention.

Figure 4A:
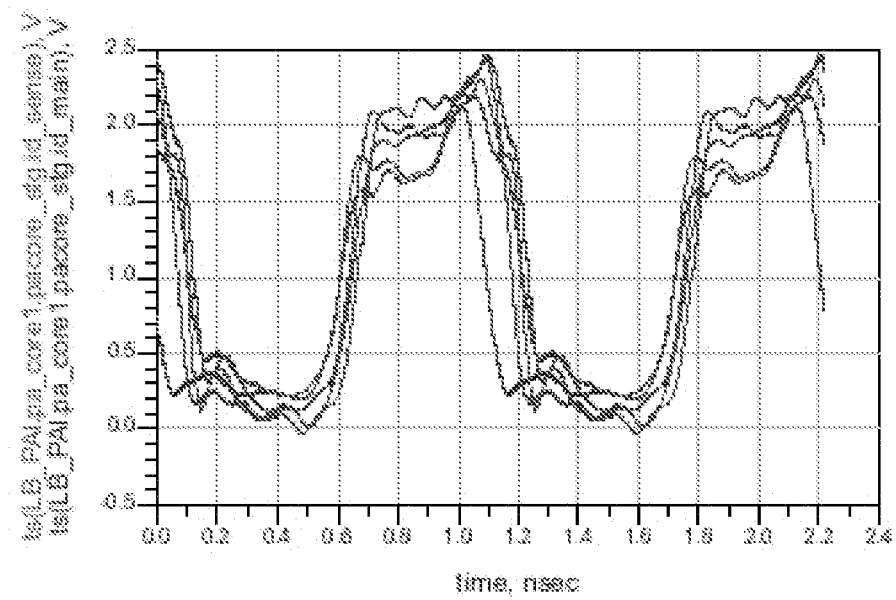
FIGS. 4A and 4B are plots describing the wave forms at two nodes of the circuit.
Figure 4B:
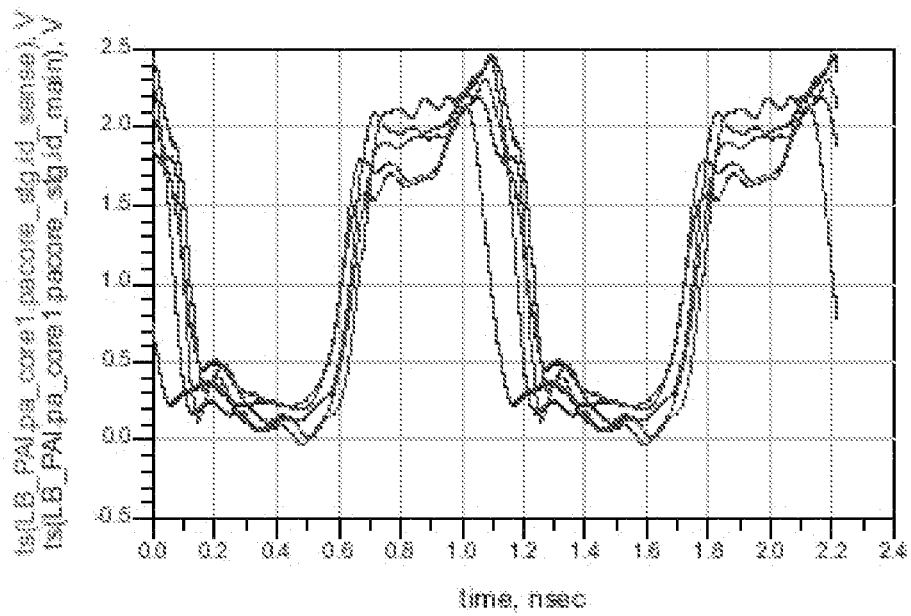
Figure 5A:
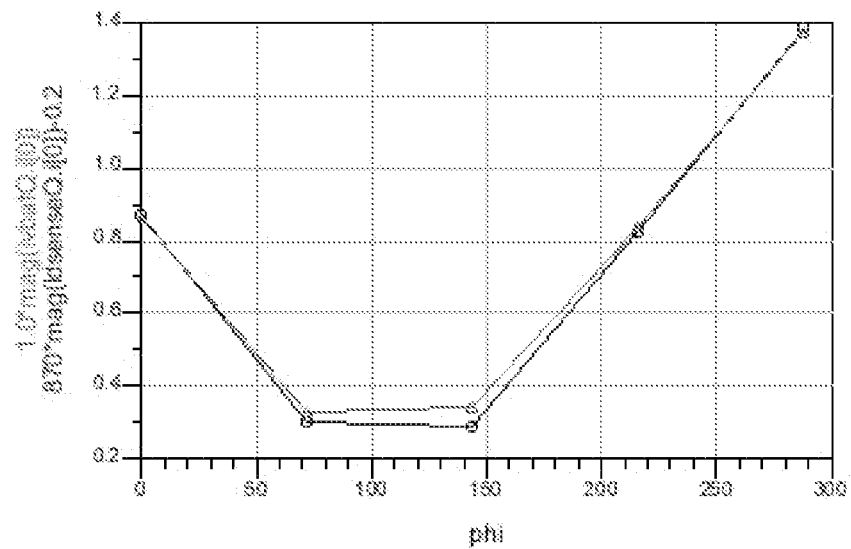
FIGS. 5A and 5B are plots showing the accuracy of the invented circuit with respect to phase changes (5A) and supply voltage changes (5B).
Figure 5B:
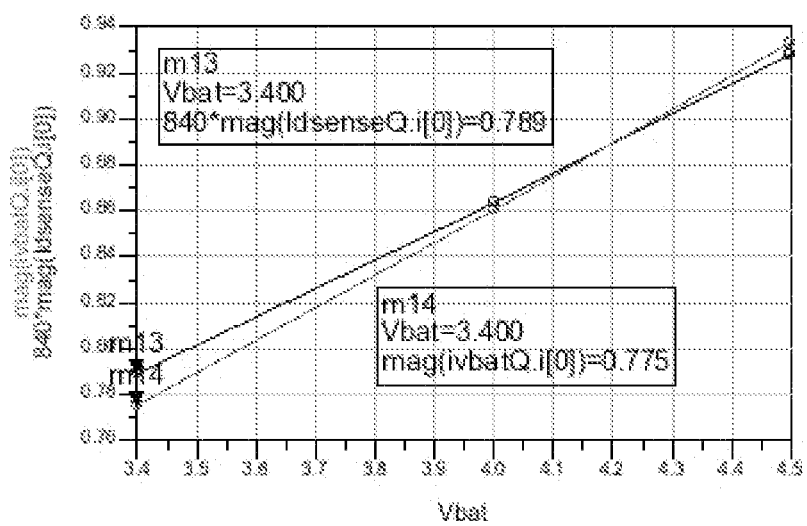

The major advantage of this invention is that after the low pass filter, the signal is DC. The negative feedback loop processes only a DC signal not the high frequency RF signal. Hence, the op-amp 315 does not have to have high bandwidth and therefore does not consume much current. It should be noted that PMOS 316 can be either a PMOS, or NMOS transistor circuitry, and the input sign of opt 315 would be swapped to maintain a negative feedback loop to force the voltages at nodes X and Y to be the same. The sensed RF current going through NMOS 311 passes through a DC extraction circuit 317 which can be as simple as a resistor and capacitor connected in parallel to provide a DC current that is equivalent to a DC average content of the sensed RF current going through NMOS 311. The wave forms shown with respect of nodes "X" and "Y" in FIG. 4A and FIG. 4B respectively, are examples for a RF PA simulation where the voltage standing-wave ratio (VSWR) angle is changed. As a result the current through the main NMOS 226 changes. FIGS. 5A and 5B depict exemplary and non-limiting plots 410 and 420 that show the accuracy of the circuit 300 of this invention. The scale down aspect ratio between NMOS 226 and NMOS 311 is N=870, the VSWR angle is changed and supply battery voltage level is changed.

It should be noted that NMOS 226 is at the output stage X of a PA and therefore may have a cascode of transistors. While the embodiment discussed hereinabove pertain to the case where the output of the cascode is used for the purpose discussed herein, it is also possible to connect Cac 312 and LPF 313 at any source-to-drain connection between two NMOS transistors forming such a cascode of the PA output stage.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor.

What is claimed is:

1. Circuitry comprising:
   an output stage of a power amplifier (PA), the output stage comprising a first transistor; and
   sensing circuitry comprising a second transistor and filtering circuitry, the filtering circuitry adapted to separate a radio frequency (RF) signal flowing through the output stage into a direct current (DC) component and an alternating current (AC) component, and the second transistor adapted to use the DC component and the AC component to replicate the RF signal, wherein a first W-over-L ratio of the first transistor is larger than one and a second W-over-L ratio of the second transistor is equal to one.

2. The circuitry of claim 1, wherein the sensing circuitry is designed to ensure that a gate-to-source voltage of the second transistor is equal to a gate-to-source voltage of the first transistor.

3. The circuitry of claim 1, wherein the sensing circuitry is designed to ensure that a drain-to-source voltage of the second transistor is equal to a drain-to-source voltage of the first transistor.

4. The circuitry of claim 1, wherein the filtering circuitry comprises a first low-pass filter (LPF) adapted to filter the DC component of a signal at a drain of the first transistor and a second LPF to filter the DC component of a signal at a drain of the second transistor.

5. The circuitry of claim 4, wherein an output of the first LPF and an output of the second LPF are coupled to inputs of an amplifier that controls a MOS device that provides current for operation of the second transistor.

6. The circuitry of claim 5, wherein the first LPF and the second LPF are one of: a zero order filter, an $n^{th}$ order filter, where n is an integer greater than one.

7. The circuitry of claim 5, wherein the first LPF and the second LPF are one of: an active filter, a passive filter.

8. The circuitry of claim 5, wherein the amplifier is one of: an operational amplifier, a common gate amplifier, a common source amplifier.

9. The circuitry of claim 1, wherein a capacitor is connected between a drain of the first transistor and a drain of the second transistor to ensure that the AC component of the RF signal is equal for both.

10. A method of sensing and converting a radio frequency (RF) signal to direct current in an output stage of a power amplifier (PA), the output stage having a first transistor, comprising:
    replicating in a second transistor having its source coupled to a source of the first transistor and having its gate coupled to a gate of the first transistor, a fraction of both direct current (DC) and alternating current (AC) components of the RF signal through the first transistor;
    low pass filtering a drain voltage of the first transistor to provide a first DC filter output;

low pass filtering a drain voltage of the second transistor to provide a second DC filter output;

controlling the average current through the second transistor to cause the first and the second DC filter outputs to be equal to provide a drain source voltage on the second transistor that is equal to a drain source voltage on the first transistor; and coupling a capacitor between a drain of the first transistor and a drain of the second transistor to ensure that the AC components of the RF signal are equal for both the first transistor and the second transistor whereby the direct current in the second transistor is proportional to the direct current in the first transistor.

11. The method of claim 10 wherein the low pass filtering is done using one of: a zero order filter, an $n^{th}$ order filter, where n is an integer greater than one.

12. The method of claim 11 wherein the low pass filtering is done using one of: an active filter, a passive filter.

13. Circuitry comprising:
an output stage of a power amplifier (PA), the output stage comprising a first transistor; and
sensing circuitry comprising a second transistor and filtering circuitry, the filtering circuitry configured to separate a radio frequency (RF) signal flowing through the output stage into a direct current (DC) component and an alternating current (AC) component, deliver the AC component directly to the second transistor, and deliver the DC component to the second transistor through a feedback loop;

wherein the second transistor is configured to replicate the RF signal.

14. The circuitry of claim 13 wherein the feedback loop forces the DC component of the RF signal at the first transistor to be about equal to the DC component of the replicated RF signal at the second transistor.

15. The circuitry of claim 13 wherein the filtering circuitry is coupled between a drain contact of the first transistor and a drain contact of the second transistor.

16. A method of sensing and converting a radio frequency (RF) signal to direct current in an output stage of a power amplifier (PA), the output stage having a first transistor, the method comprising the steps of:
passing a direct current (DC) component of the RF signal at the output of the first transistor to an output of a second transistor through a feedback loop;
passing an alternating current (AC) component of the RF signal at the output of the first transistor directly to the output of the second transistor; and
replicating the RF signal at the output of the first transistor in the output of the second transistor using the DC component and the AC component.

17. The method of claim 16 wherein the feedback loop forces the DC component of the RF signal at the output of the first transistor to be about equal to the DC component of the replicated RF signal at the output of the second transistor.

18. The method of claim 16 wherein the output of the first transistor is a drain of the first transistor, and the output of the second transistor is a drain of the second transistor.

* * * * *